(12) United States Patent
Shin (10) Patent No.: US 10,467,125 B2
(45) Date of Patent: Nov. 5, 2019

(54) SATELLITE SOFTWARE VERIFICATION SYSTEM

(71) Applicant: KOREA AEROSPACE RESEARCH INSTITUTE, Daejeon (KR)

(72) Inventor: Hyun-Kyu Shin, Sejong-si (KR)

(73) Assignee: KOREA AEROSPACE RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 16/150,384

(22) Filed: Oct. 3, 2018

(65) Prior Publication Data

US 2019/0155716 A1    May 23, 2019

(30) Foreign Application Priority Data

Nov. 20, 2017 (KR) .................. 10-2017-0154980

(51) Int. Cl.
| | |
|---|---|
| *G06F 11/36* | (2006.01) |
| *H04B 7/185* | (2006.01) |
| *G06F 17/50* | (2006.01) |
| *G06F 11/34* | (2006.01) |

(52) U.S. Cl.
CPC ...... *G06F 11/3616* (2013.01); *G06F 11/3457* (2013.01); *G06F 11/3664* (2013.01); *G06F 11/3668* (2013.01); *G06F 17/5022* (2013.01); *H04B 7/18513* (2013.01); *H04B 7/18515* (2013.01); *H04B 7/18517* (2013.01); *H04B 7/18519* (2013.01)

(58) Field of Classification Search
CPC ... G01S 19/23; G05D 1/0883; G06F 11/3616; H04B 7/18515

USPC .......... 455/430, 418, 427, 12.1, 3.01, 3.02; 342/357.62

See application file for complete search history.

(56) References Cited

U.S. PATENT DOCUMENTS

| | | | |
|---|---|---|---|
| 6,052,588 A | 4/2000 | Mo et al. | |
| 2008/0082222 A1* | 4/2008 | Kim ............... | G05D 1/0883 701/3 |
| 2013/0127663 A1* | 5/2013 | Kim ............... | G01S 19/23 342/357.62 |

FOREIGN PATENT DOCUMENTS

| | | |
|---|---|---|
| CN | 104618171 A | 5/2015 |
| CN | 106506058 A | 3/2017 |
| KR | 1998-0027624 A | 7/1998 |
| KR | 10-1998-0023366 B1 | 12/2005 |

OTHER PUBLICATIONS

Extended European Search Report dated Feb. 1, 2019, by the European Patent Office in corresponding European Patent Application No. 18198630.8-1214. (11 pages).

Office Action dated Feb. 19, 2019, by the Korean Intellectual Property Office in corresponding Korean Patent Application No. 10-2017-0154980. (24 pages).

\* cited by examiner

*Primary Examiner* — John J Lee
(74) *Attorney, Agent, or Firm* — Buchanan Ingersoll & Rooney PC (57) ABSTRACT

Provided is a method of verifying satellite software using a simulator, the method including receiving memory data of the simulator from the simulator in a first communication mode, the simulator being loaded with the satellite software to be verified; generating a first telemetry frame from the memory data based on a telemetry frame generation rule; and analyzing the first telemetry frame.

12 Claims, 5 Drawing Sheets

SATELLITE SOFTWARE VERIFICATION SYSTEM

CROSS-REFERENCE TO RELATED APPLICATION

This application claims the benefit of Korean Patent Application No. 10-2017-0154980, filed on Nov. 20, 2017, in the Korean Intellectual Property Office, the disclosure of which is incorporated herein in its entirety by reference.

BACKGROUND

1. Field

One or more embodiments relate to a satellite software verification system, and more particularly, to a satellite software verification method, a satellite software verification system, and a satellite software verification program.

2. Description of the Related Art

Satellites have been sent into space for various purposes and missions. These satellites are loaded with software for accomplishing the purposes and missions.

Due to the distinct characteristics of a satellite, software loaded on the satellite needs to have high reliability. Accordingly, the software undergoes a verification process using a simulator or the like before the satellite is launched.

According to the related art, data is received from a simulator, which is loaded with software to be verified, in the same manner as a satellite actually transmits data and then verified. Therefore, a long verification time is required, and there is a limit to verifiable items.

As a result, development time and cost increases, and the software may not be precisely verified.

SUMMARY

One or more embodiments include a satellite software verification method, device, and system for quickly verifying software with respect to main items without waiting for a plurality of telemetry frames to be sequentially received from a simulator.

One or more embodiments include a satellite software verification method, device, and system for obtaining information regarding various items other than an item regarding which information is obtainable from a telemetry frame and verifying software based on the information.

One or more embodiments include a satellite software verification method, device, and system for verifying software in an environment substantially the same as a real environment.

Additional aspects will be set forth in part in the description which follows and, in part, will be apparent from the description, or may be learned by practice of the presented embodiments.

According to one or more embodiments, a method of verifying satellite software using a simulator includes receiving memory data of the simulator from the simulator in a first communication mode, the simulator being loaded with the satellite software to be verified; generating a first telemetry frame from the memory data based on a telemetry frame generation rule; and analyzing the first telemetry frame.

The method may further include analyzing the memory data after the receiving of the memory data, wherein the analyzing of the memory data may include performing analysis on all items included in the memory data except for an item included in the first telemetry frame.

The method may further include, after the analyzing of the memory data, displaying at least one result among a result of analyzing the first telemetry frame and a result of analyzing the memory data; debugging the satellite software based on a user input corresponding to the at least one result; and uploading the satellite software to the simulator, the satellite software having been debugged.

The method may further include receiving a second telemetry frame from the simulator in a second communication mode, the second communication mode being different from the first communication mode; and analyzing the second telemetry frame.

The method may further include, after the analyzing of the second telemetry frame, displaying at least one result among a result of analyzing the first telemetry frame and a result of analyzing the second telemetry frame; debugging the satellite software based on a user input corresponding to the at least one result; and uploading the satellite software to the simulator, the satellite software having been debugged.

The first communication mode may provide a higher data rate than the second communication mode, and the second communication mode may be a communication mode used to connect a satellite with a ground station.

According to one or more embodiments, a satellite software verification device using a simulator includes a controller configured to receive memory data of the simulator from the simulator in a first communication mode, the simulator being loaded with the satellite software to be verified, to generate a first telemetry frame from the memory data based on a telemetry frame generation rule, and to analyze the first telemetry frame.

The controller may be further configured to perform analysis on all items included in the memory data except for an item included in the first telemetry frame.

The controller may be further configured to display at least one result among a result of analyzing the first telemetry frame and a result of performing analysis on all items included in the memory data except for the item included in the first telemetry frame, to debug the satellite software based on a user input corresponding to the at least one result, and to upload the satellite software to the simulator, the satellite software having been debugged.

The controller may be further configured to receive a second telemetry frame from the simulator in a second communication mode and to analyze the second telemetry frame, the second communication mode being different from the first communication mode.

The controller may be further configured to display at least one result among a result of analyzing the first telemetry frame and a result of analyzing the second telemetry frame, to debug the satellite software based on a user input corresponding to the at least one result, and to upload the satellite software to the simulator, the satellite software having been debugged.

The first communication mode may provide a higher data rate than the second communication mode, and the second communication mode may be a communication mode used to connect a satellite with a ground station.

According to one or more embodiments, a satellite software verification system includes a simulator configured to transmit memory data to a satellite software verification device in a first communication mode and to transmit a second telemetry frame to the satellite software verification device in a second communication mode, the simulator being loaded with satellite software to be verified; and the satellite software verification device configured to receive the memory data of the simulator from the simulator in the first communication mode, to generate a first telemetry frame from the memory data based on a telemetry frame generation rule, to analyze the first telemetry frame, to receive the second telemetry frame from the simulator in the second communication mode, and to analyze the second telemetry frame, the second communication mode being different from the first communication mode.

The satellite software verification device may be further configured to perform analysis on all items included in the memory data except for an item included in the first telemetry frame.

The satellite software verification device may be further configured to display at least one result among a result of analyzing the first telemetry frame, a result of analyzing the second telemetry frame, and a result of performing analysis on all items included in the memory data except for the item included in the first telemetry frame, to debug the satellite software based on a user input corresponding to the at least one result, and to upload the satellite software to the simulator, the satellite software having been debugged.

The first communication mode may provide a higher data rate than the second communication mode, and the second communication mode may be a communication mode used to connect a satellite with a ground station.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

The terms first, second, etc. are used in the description of the embodiments to only distinguish one element from another. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features or components, but do not preclude the presence or addition of one or more other features or components. In the drawings, the size of elements may be exaggerated or reduced for clarity. For instance, the size and shape of each element may be arbitrarily illustrated in the drawings, and therefore, the present disclosure is not limited to the drawings.

As used herein, the term "and/or" includes any and all combinations of one or more of the associated listed items. Expressions such as "at least one of," when preceding a list of elements, modify the entire list of elements and do not modify the individual elements of the list.

Figure 1:
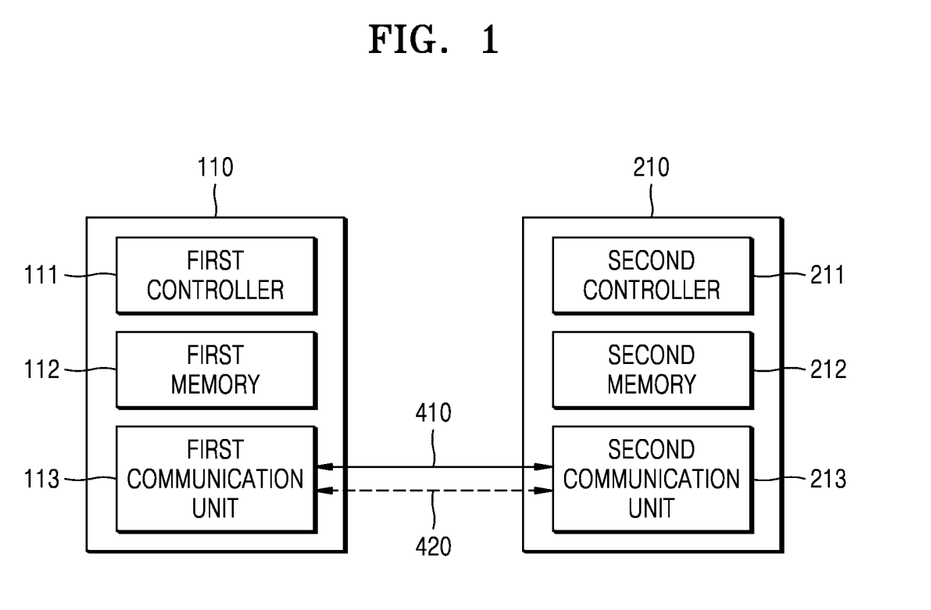
FIG. 1 is a schematic diagram of a satellite software verification system according to an embodiment.

FIG. 1 is a schematic diagram of a satellite software verification system according to an embodiment.

Referring to FIG. 1, the satellite software verification system may include a satellite software verification device 110 and a simulator 210.

In the present disclosure, the term "satellite" may refer to any one of various devices that move in a three-dimensional space. For example, a satellite may be a device that exchanges data with a ground station while revolving or moving around the earth and/or another planet. In this case, the satellite may be loaded onto a launch vehicle or the like and launched from a launch pad. At this time, the satellite may be loaded with software for a certain purpose and/or usage.

A satellite may be an air vehicle that flies in the atmosphere according to a certain purpose and/or usage. In this case, the satellite may take off and/or land without using a launch vehicle and/or a launch pad. This is just an example, and the concept of the present disclosure is not limited thereto.

According to an embodiment, a satellite may transmit a signal to a ground station at predetermined time intervals. In other words, the satellite may transmit a signal to the ground station with a certain time period. For example, the satellite may transmit a signal with a period of five seconds.

At this time, the signal transmitted from the satellite to the ground station may be a telemetry signal and may be transmitted in units of frames and/or packets. Accordingly, the satellite may transmit a frame and/or a packet to the ground station at predetermined time intervals.

The frame and/or packet transmitted from the satellite to the ground station may include information about the place of the frame and/or packet in a sequence. For example, when the frame and/or packet transmitted from the satellite to the ground station is the tenth one, the frame and/or packet may include information indicating that the frame and/or packet is the tenth frame and/or packet that is transmitted.

Besides the sequence information described above, various data (e.g., data about the state of a satellite) complying with a predetermined rule and/or standard may also be included in the frame and/or packet. This will be described in detail below.

In the present disclosure, a ground station may refer to a device which exchanges signals with a satellite, analyzes the state of the satellite from a telemetry signal received from the satellite, and controls the satellite based on the result of the analysis. The ground station may include an antenna, which transmits and receives signals, and an antenna drive unit, which controls an angle of the antenna. The ground station may also include a controller.

In an embodiment, the satellite software verification device 110 and the simulator 210 may be provided separately from the satellite and the ground station, which have been described above. For example, the satellite software verification device 110 and the simulator 210 may be provided in research facilities for the manufacture or development of satellites.

The satellite software verification device 110 may receive memory data of the simulator 210, which is loaded with satellite software to be verified, from the simulator 210 in a first communication mode and verify the satellite software based on the memory data.

The simulator 210 may be loaded with the satellite software to be verified and may transmit the memory data to the satellite software verification device 110 in the first communication mode.

In detail, each of the satellite software verification device 110 and the simulator 210 may include a controller 111 or 211, a memory 112 or 212, and a communication unit 113 or 213.

In an embodiment, the controller 111 or 211 may include any type of device that processes data like a processor. Here, the term "processor" may refer to a data processing device that is embedded in hardware and has a circuit physically structured to perform a function represented by a command or code in a program. Examples of the data processing device embedded in hardware may include a microprocessor, a central processing unit (CPU), a processor core, a multiprocessor, an application-specific integrated circuit (ASIC), and a field programmable gate array (FPGA), but the scope of the present disclosure is not limited thereto.

In an embodiment, the memory 112 or 212 may temporarily or permanently store data processed in either or both of the satellite software verification device 110 and the simulator 210. The memory 112 or 212 may include a magnetic storage medium or a flash storage medium, but the scope of the present disclosure is not limited thereto. Meanwhile, data transmitted from the simulator 210 to the satellite software verification device 110 may be data that has been stored in the memory 212 of the simulator 210. This will be described in detail below.

In an embodiment, the communication unit 113 or 213 may be a device which includes hardware and software needed to transmit and receive signals, such as control signals or data signals (e.g., telemetry signals described above), through wired and/or wireless connection with another device, but the scope of the present disclosure is not limited thereto.

The communication unit 113 or 213 may enable the satellite software verification device 110 and the simulator 210 to exchange data in at least one of a first communication mode 410 and a second communication mode 420. At this time, the first communication mode 410 may provide a higher data rate than the second communication mode 420. The first communication mode 410 may involve wired connection. The second communication mode 420 may be the communication mode that is used to connect the satellite with the ground station. The second communication mode 420 may be one of various wireless communication modes.

Although the satellite software verification device 110 and the simulator 210 are illustrated as separate members in FIG. 1, they may be a unitary member. In other words, the satellite software verification device 110 and the simulator 210 may be physically separated members or may be separate applications, processes, or tasks that are executed by one processor.

For convenience's sake in the description, it is assumed that the satellite software verification device 110 and the simulator 210 are separate members, and the controller 111, the memory 112, and the communication unit 113 of the satellite software verification device 110 are referred to as a first controller 111, a first memory 112, and a first communication unit 113. Similarly, the controller 211, the memory 212, and the communication unit 213 of the simulator 210 are referred to as a second controller 211, a second memory 212, and a second communication unit 213.

Figure 2:
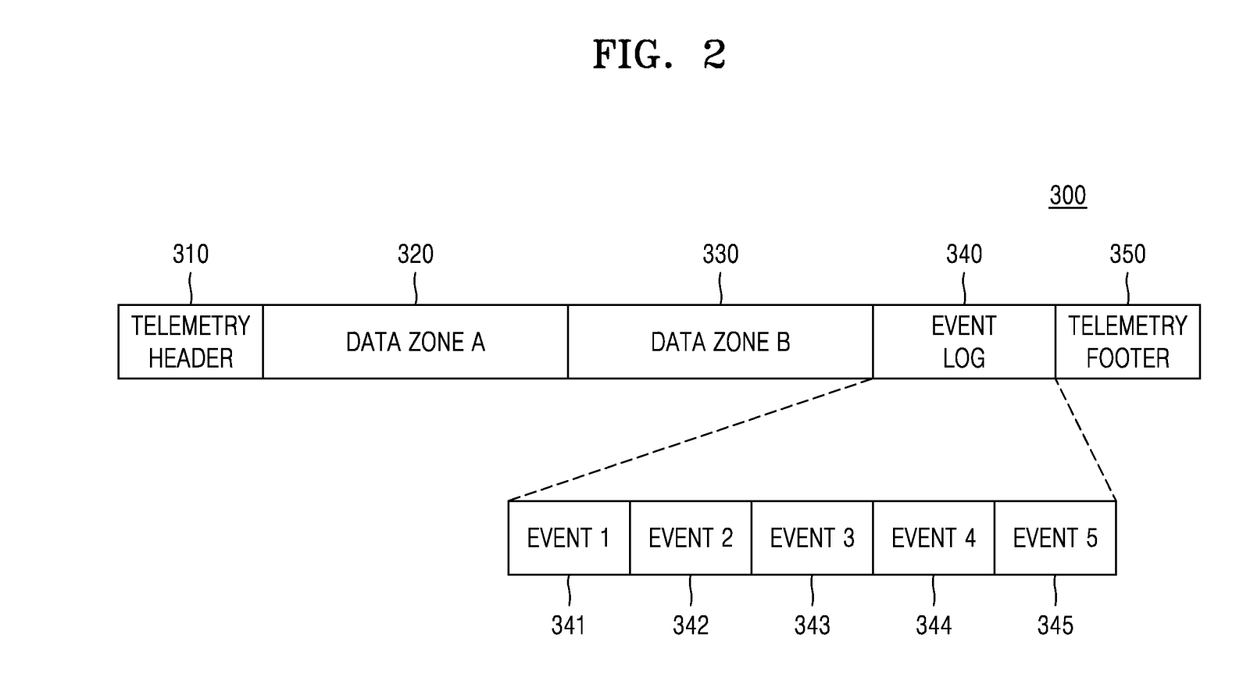
FIG. 2 is a schematic diagram of the structure of a telemetry transfer frame according to an embodiment.

FIG. 2 is a schematic diagram of the structure of a telemetry transfer frame 300 according to an embodiment.

Referring to FIG. 2, the telemetry transfer frame 300 may include a header 310, a first data zone 320, a second data zone 330, an event log 340, and a footer 350.

The header 310 and the footer 350 may include data needed to transmit and receive the telemetry transfer frame 300. For example, at least one of the header 310 and the footer 350 may include a transmission order (or a serial number) of the telemetry transfer frame 300.

The first data zone 320 and the second data zone 330 may include data to be transmitted from the satellite to the ground station. For example, the first data zone 320 and the second data zone 330 may include information about operational status, such as location, speed, and residual energy, of the satellite.

The event log 340 may include data about an event that has occurred in the satellite. The event log 340 may include a plurality of event slots 341 through 345 for respectively recording event data.

The telemetry transfer frame 300, and more particularly, the first data zone 320 and the second data zone 330 including data about the status of the satellite may have a limited size. In addition, a communication mode (i.e., the second communication mode 420 described above) for transmitting and receiving the telemetry transfer frame 300 has a speed limit. Accordingly, it has taken a long time to check whether satellite software to be verified normally operates in the simulator 210.

In other words, there are a communication speed limit and a transfer frame size limit in verifying satellite software according to the related art, which hinders rapid development of satellite software.

In an embodiment, the simulator 210 loaded with satellite software to be verified may be connected with the satellite software verification device 110 in a first communication mode, which provides a higher speed than a second communication mode (i.e., the communication mode that is used to connect the satellite with the ground station), as well as in the second communication mode. In addition, memory data of the simulator 210 may be downloaded as it is to the satellite software verification device 110 in the first communication mode and used to verify the satellite software, so that a verification speed may be increased.

Hereinafter, a satellite software verification method according to an embodiment will be described with reference to FIG. 3, focusing on the operations of the first controller 111 of the satellite software verification device 110.

Figure 3:
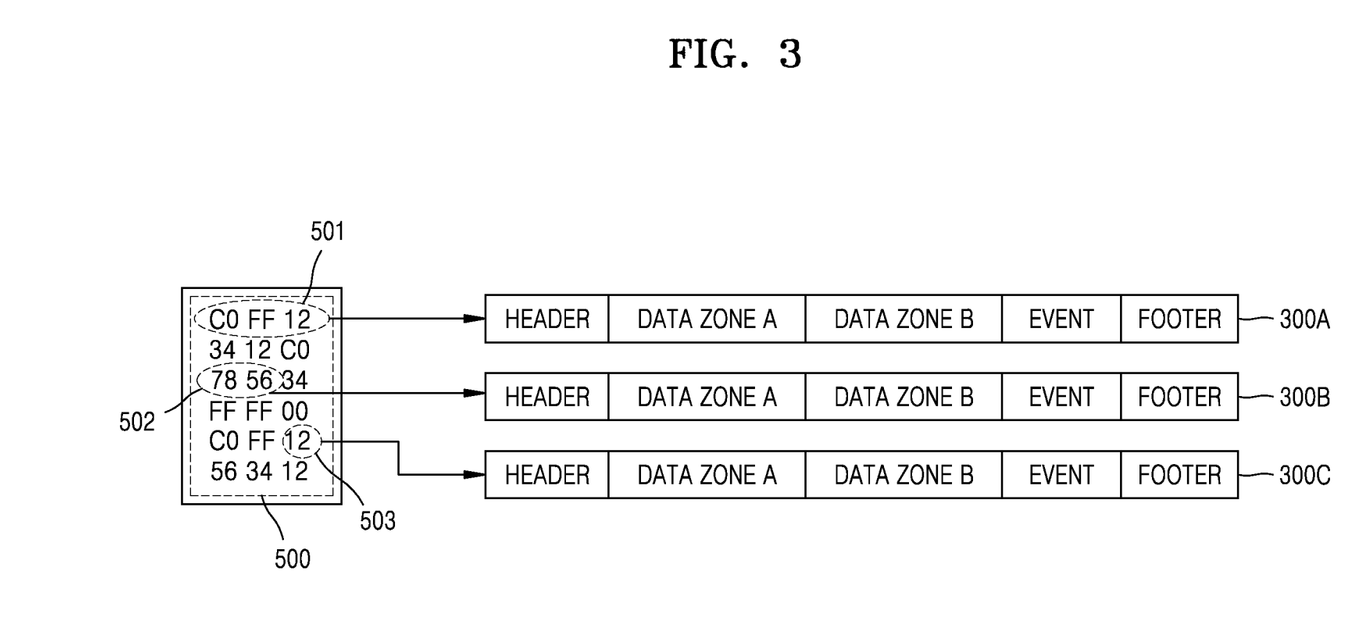
FIG. 3 is a diagram for explaining a method of generating a first telemetry frame from memory data using a first controller, according to an embodiment.

FIG. 3 is a diagram for explaining a method of generating first telemetry frames 300A, 300B, and 300C from memory data 500 using the first controller 111, according to an embodiment.

In an embodiment, the first controller 111 of the satellite software verification device 110 may receive the memory data 500 of the simulator 210, which is loaded with satellite software to be verified, from the simulator 210 in the first communication mode.

The memory data 500 may enable the status of the satellite, which results from execution of the software to be verified, to be analyzed and/or grasped. The memory data 500 may refer to content recorded in the second memory 212 of the simulator 210 or data obtained from each of modules mounted on the simulator 210, but the scope of the present disclosure is not limited thereto.

In an embodiment, the first controller 111 may generate the first telemetry frames 300A, 300B, and 300C from the memory data 500 based on a telemetry frame generation rule.

In other words, the first controller 111 may generate the first telemetry frames 300A, 300B, and 300C in the same manner as the satellite generates a transfer frame to be transmitted to the ground station when the software to be verified has been loaded to the satellite. At this time, since the first controller 111 generates the first telemetry frames 300A, 300B, and 300C based on the memory data 500 of the simulator 210, the first telemetry frames 300A, 300B, and 300C may be the same as transfer frames generated by the satellite which have been loaded with the software. The term "telemetry frame" has been described with reference to FIG. 2 above, and thus detailed descriptions thereof will be omitted.

The first controller 111 may generate the first telemetry frame 300A that includes first partial data 501 of the memory data 500. Similarly, the first controller 111 may generate the first telemetry frame 300B that includes second partial data 502 of the memory data 500 and the first telemetry frame 300C that includes third partial data 503 of the memory data 500.

In an embodiment, the first controller 111 may analyze the first telemetry frames 300A, 300B, and 300C which have been generated as described above. At this time, only some of items included in the memory data 500 may be included in the first telemetry frames 300A, 300B, and 300C. For example, among a plurality of items for the simulator 210, only some items requiring real-time monitoring may be included in the first telemetry frames 300A, 300B, and 300C.

Accordingly, software verification may be quickly performed with respect to main items without waiting for a plurality of telemetry frames to be sequentially received from the simulator 210.

In an embodiment, the first controller 111 may fully analyze the memory data 500. At this time, the first controller 111 may perform analysis on all items included in the memory data 500 except for the items included in the first telemetry frames 300A, 300B, and 300C. As described above, the first telemetry frames 300A, 300B, and 300C respectively include only the first through third partial data 501, 502, and 503 of the memory data 500. Therefore, the first controller 111 may further perform verification with respect to the rest of the memory data 500 for the full verification of the software.

In an embodiment, the first controller 111 may receive a second telemetry frame from the simulator 210 in the second communication mode which is different from the first communication mode and analyze the second telemetry frame. As described above, the first communication mode may be the communication mode used when receiving the memory data 500 from the simulator 210. The second communication mode may be a communication mode used to connect the satellite with the ground station. The second telemetry frame may be generated by the simulator 210 according to the same generation rule as that used when the satellite software verification device 110 generates the first telemetry frames 300A, 300B, and 300C from the memory data 500.

As described above, the first controller 111 may analyze all of the memory data 500, the first telemetry frames 300A, 300B, and 300C generated from the memory data 500, or the second telemetry frame received from the simulator 210 in the second communication mode so as to verify software integrity.

At this time, when all of the memory data 500 is analyzed, information about various items may be obtained besides information about items obtainable from a telemetry frame. When the first telemetry frames 300A, 300B, and 300C are analyzed, the software may be verified based on information in a format in which the information is actually received from the satellite loaded with the software, and verification time may be reduced. When the second telemetry frame is analyzed, the software may be verified in an environment substantially the same as a real environment.

In an embodiment, the first controller 111 may display at least one of the results of the three types of analysis described above. At this time, the first controller 111 may display the analysis result through a display (not shown) of the satellite software verification device 110. Thereafter, the first controller 111 may debug the software based on a user input corresponding to the analysis result. At this time, the debugging of the software may refer to revising at least part of the software based on the user input. The user input may be obtained through an input unit (not shown) of the satellite software verification device 110.

Thereafter, the first controller 111 may upload the software, which has been debugged as described above, to the simulator 210. The first controller 111 may check the reliability of the debugged software by repeating the verification procedure described above with respect to the debugged software which has been uploaded to the simulator 210.

As described above, according to an embodiment, satellite software may be quickly verified in various aspects, and therefore, satellite development or repair time may be reduced.

Figure 4:
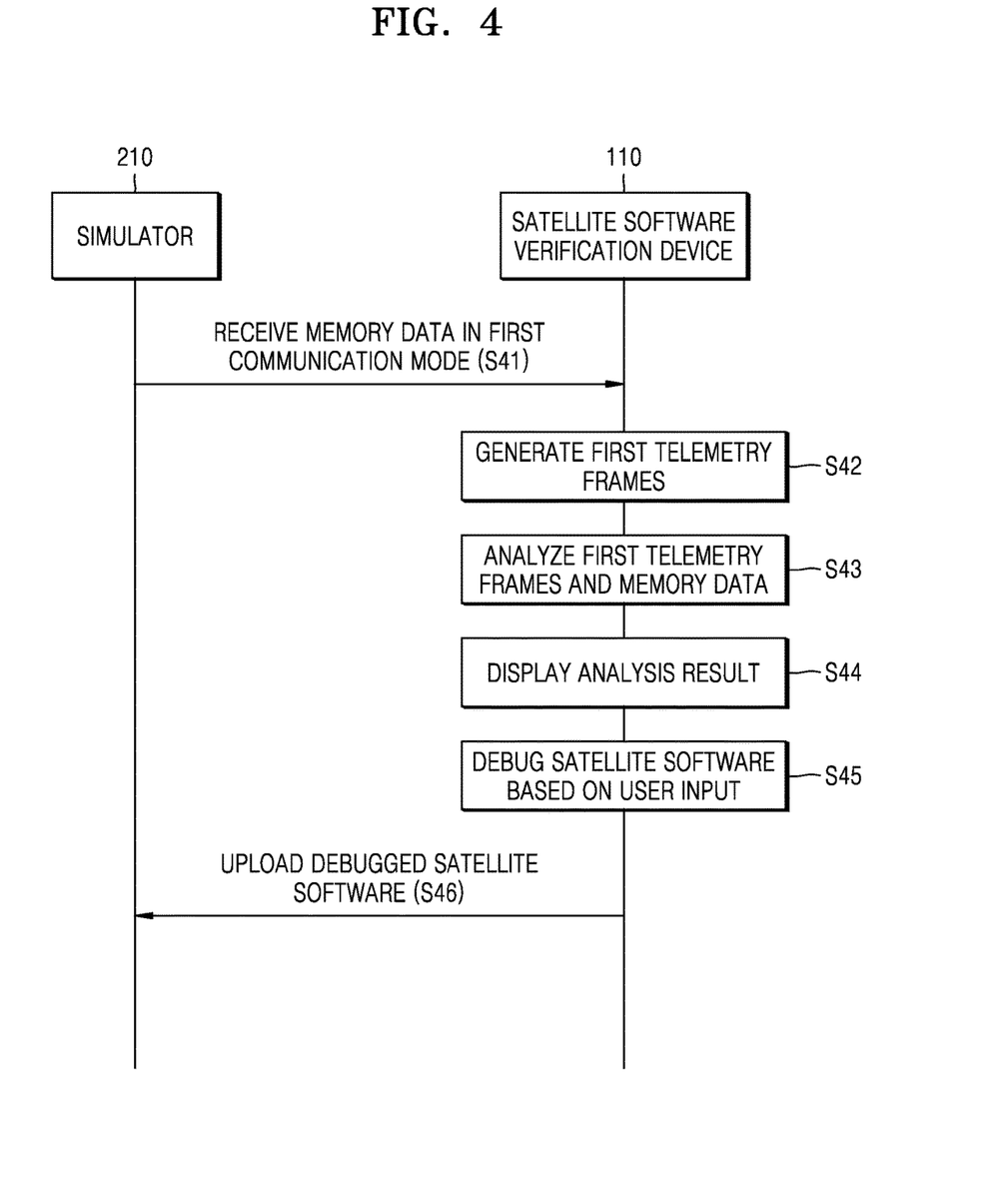
FIGS. 4 and 5 are flowcharts of satellite software verification methods performed by a satellite software verification device, according to other embodiments.
Figure 5:
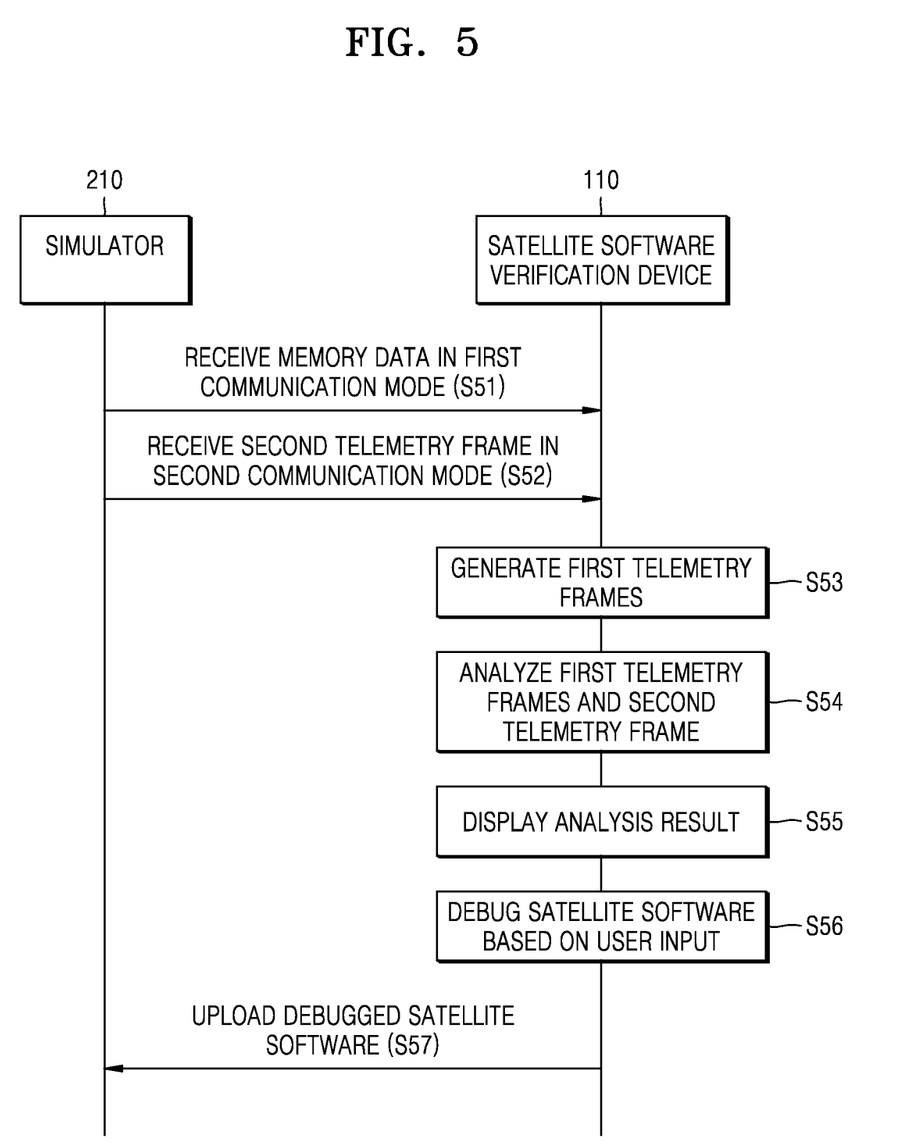

FIGS. 4 and 5 are flowcharts of satellite software verification methods performed by the satellite software verification device 110, according to other embodiments. Redundant descriptions that have been made with reference to FIGS. 1 through 3 will be omitted, but FIGS. 1 through 3 will also be referred to for the description below.

In an embodiment, the satellite software verification device 110 may receive the memory data 500 of the simulator 210, which is loaded with satellite software to be verified, from the simulator 210 in the first communication mode in operation S41.

The memory data 500 may enable the status of a satellite, which results from execution of the software to be verified, to be analyzed and/or grasped. The memory data 500 may refer to content recorded in the second memory 212 of the simulator 210 or data obtained from each of modules mounted on the simulator 210, but the scope of the present disclosure is not limited thereto.

The satellite software verification device 110 may generate the first telemetry frames 300A, 300B, and 300C from the memory data 500 based on a telemetry frame generation rule in operation S42.

In other words, the satellite software verification device 110 may generate the first telemetry frames 300A, 300B, and 300C in the same manner as the satellite generates a transfer frame to be transmitted to a ground station when the software to be verified has been loaded to the satellite. At this time, since the satellite software verification device 110 generates the first telemetry frames 300A, 300B, and 300C based on the memory data 500 of the simulator 210, the first telemetry frames 300A, 300B, and 300C may be the same as transfer frames generated by the satellite which have been loaded with the software. The term "telemetry frame" has been described with reference to FIG. 2 above, and thus detailed descriptions thereof will be omitted.

The satellite software verification device 110 may generate the first telemetry frame 300A that includes the first partial data 501 of the memory data 500. Similarly, the satellite software verification device 110 may generate the first telemetry frame 300B that includes the second partial data 502 of the memory data 500 and the first telemetry frame 300C that includes the third partial data 503 of the memory data 500.

The satellite software verification device 110 may analyze the first telemetry frames 300A, 300B, and 300C, which have been generated as described above, and the memory data 500 in operation S43. At this time, only some of items included in the memory data 500 may be included in the first telemetry frames 300A, 300B, and 300C. For example, among a plurality of items for the simulator 210, only some items requiring real-time monitoring may be included in the first telemetry frames 300A, 300B, and 300C.

Accordingly, software verification may be quickly performed with respect to main items without waiting for a plurality of telemetry frames to be sequentially received from the simulator 210.

In an embodiment, the satellite software verification device 110 may analyze the memory data 500. At this time, the satellite software verification device 110 may perform analysis on all items included in the memory data 500 except for the items included in the first telemetry frames 300A, 300B, and 300C. As described above, the first telemetry frames 300A, 300B, and 300C respectively include only the first through third partial data 501, 502, and 503 of the memory data 500. Therefore, the satellite software verification device 110 may further perform verification with respect to the rest of the memory data 500 for the full verification of the software.

Consequently, the satellite software verification device 110 may analyze all of the memory data 500 or the first telemetry frames 300A, 300B, and 300C generated from the memory data 500 so as to verify software integrity.

At this time, when all of the memory data 500 are analyzed, information about various items may be obtained besides information about items obtainable from a telemetry frame.

When the first telemetry frames 300A, 300B, and 300C are analyzed, the software may be verified based on information in a format in which the information is actually received from the satellite loaded with the software, and verification time may be reduced.

The satellite software verification device 110 may display at least one of the results of the two types of analysis described above in operation S44. At this time, the satellite software verification device 110 may display the analysis result through a display (not shown) thereof. Thereafter, the satellite software verification device 110 may debug the software based on a user input corresponding to the analysis result in operation S45. At this time, the debugging of the software may refer to revising at least part of the software based on the user input. The user input may be obtained through an input unit (not shown) of the satellite software verification device 110.

Thereafter, the satellite software verification device 110 may upload the software, which has been debugged as described above, to the simulator 210 in operation S46. The satellite software verification device 110 may check the reliability of the debugged software by repeating the procedure described above with respect to the debugged software which has been uploaded to the simulator 210.

As described above, according to an embodiment, satellite software may be quickly verified in various aspects, and therefore, satellite development or repair time may be reduced.

One or more embodiment will be described with reference to FIG. 5 below.

In an embodiment, the satellite software verification device 110 may receive the memory data 500 of the simulator 210, which is loaded with satellite software to be verified, from the simulator 210 in the first communication mode in operation S51.

The satellite software verification device 110 may also receive a second telemetry frame from the simulator 210 in the second communication mode which is different from the first communication mode in operation S52. As described above, the first communication mode may be the communication mode used when receiving the memory data 500 from the simulator 210. The second communication mode may be a communication mode used to connect the satellite with the ground station. The second telemetry frame may be generated by the simulator 210 according to the same generation rule as that used when the satellite software verification device 110 generates the first telemetry frames 300A, 300B, and 300C from the memory data 500.

The satellite software verification device 110 may generate the first telemetry frames 300A, 300B, and 300C from the memory data 500 based on the telemetry frame generation rule in operation S53. In other words, the satellite software verification device 110 may generate the first telemetry frames 300A, 300B, and 300C in the same manner as the satellite generates a transfer frame to be transmitted to a ground station when the software to be verified has been loaded to the satellite. At this time, since the satellite software verification device 110 generates the first telemetry frames 300A, 300B, and 300C based on the memory data 500 of the simulator 210, the first telemetry frames 300A, 300B, and 300C may be the same as transfer frames generated by the satellite which have been loaded with the software. The term "telemetry frame" has been described with reference to FIG. 2 above, and thus detailed descriptions thereof will be omitted.

The satellite software verification device 110 may generate the first telemetry frame 300A that includes the first partial data 501 of the memory data 500. Similarly, the satellite software verification device 110 may generate the first telemetry frame 300B that includes the second partial data 502 of the memory data 500 and the first telemetry frame 300C that includes the third partial data 503 of the memory data 500.

The satellite software verification device 110 may analyze the first telemetry frames 300A, 300B, and 300C, which have been generated as described above, and the second telemetry frame, which has been received from the simulator 210, in operation S54. At this time, only some of items included in the memory data 500 may be included in the first telemetry frames 300A, 300B, and 300C. For example, among a plurality of items for the simulator 210, only some items requiring real-time monitoring may be included in the first telemetry frames 300A, 300B, and 300C. Accordingly, software verification may be quickly performed with respect to main items without waiting for a plurality of telemetry frames to be sequentially received from the simulator 210.

The satellite software verification device 110 may analyze the first telemetry frames 300A, 300B, and 300C, which have been generated from the memory data 500, or the second telemetry frame, which has been received from the simulator 210 in the second communication mode, so as to verify software integrity. The satellite software verification device 110 may analyze all of the memory data 500, as described above with reference to FIG. 4, to verify the software integrity.

At this time, when the first telemetry frames 300A, 300B, and 300C are analyzed, the software may be verified based on information in a format in which the information is actually received from the satellite loaded with the software, and verification time may be reduced. When the second telemetry frame is analyzed, the software may be verified in an environment substantially the same as a real environment.

The satellite software verification device 110 may display at least one of the results of the two types of analysis described above in operation S55. At this time, the satellite software verification device 110 may display the analysis result through a display (not shown) thereof. Thereafter, the satellite software verification device 110 may debug the software based on a user input corresponding to the analysis result in operation S56. At this time, the debugging of the software may refer to revising at least part of the software based on the user input. The user input may be obtained through an input unit (not shown) of the satellite software verification device 110.

Thereafter, the satellite software verification device 110 may upload the software, which has been debugged as described above, to the simulator 210 in operation S57. The satellite software verification device 110 may check the reliability of the debugged software by repeating the procedure described above with respect to the debugged software which has been uploaded to the simulator 210.

As described above, according to an embodiment, satellite software may be quickly verified in various aspects, and therefore, satellite development or repair time may be reduced.

According to embodiments, software verification may be quickly performed with respect to main items without waiting for a plurality of telemetry frames to be sequentially received from a simulator.

In addition, information about various items may be obtained besides information about items obtainable from a telemetry frame, and the software verification may be performed based on the information. Furthermore, satellite software may be quickly verified in various aspects, so that satellite development or repair time may be reduced.

An embodiment of the present disclosure can also be embodied as a computer program executed on a computer using various elements. The computer program may be recorded in a computer readable recording medium. Examples of the computer readable recording medium may include magnetic media such as hard disks, floppy disks, and magnetic tapes; optical media such as CD-ROMs and DVDs; magneto-optical media such as floptical disks; and hardware devices such as read-only memory (ROM), random-access memory (RAM), and flash memory that are specially configured to store and execute program commands. Furthermore, the computer readable recording medium may also include an intangible medium embodied as being transmittable over network. For example, the computer readable recording medium may be embodied as software or an application which can be transmitted and distributed over network.

Meanwhile, the computer program may be specially designed and configured for the present disclosure or may have been known to and usable by those skilled in the field of computer software. Examples of the computer program may include machine codes created by a compiler and high-level language codes that can be executed in a computer using an interpreter.

For clarity of the description, an explanation of electronic configuration, control systems, and software according to the related art and other functional aspect of the system may be omitted. Connecting lines or members among elements shown in the drawings show functional connections and/or physical or circuit connections as examples and may be manifested as various replaceable or additional, functional, physical or circuit connections in an actual device. Unless an element is specifically mentioned with the terms "essential", "significantly", etc., the element may not be indispensible for an embodiment.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the disclosure as defined by the following claims.

What is claimed is:

1. A method of verifying satellite software using a simulator, the method comprising:
   receiving memory data of the simulator from the simulator in a first communication mode, the simulator being loaded with the satellite software to be verified;
   generating a first telemetry frame from the memory data based on a telemetry frame generation rule;
   analyzing the first telemetry frame;
   receiving a second telemetry frame from the simulator in a second communication mode, the second communication mode being different from the first communication mode; and
   analyzing the second telemetry frame;
   after the analyzing of the second telemetry frame:
      displaying at least one result among a result of analyzing the first telemetry frame and a result of analyzing the second telemetry frame;
      debugging the satellite software based on a user input corresponding to the at least one result; and
      uploading the satellite software to the simulator, the satellite software having been debugged.

2. The method of claim 1, further comprising analyzing the memory data after the receiving of the memory data, wherein the analyzing of the memory data comprises performing analysis on all items included in the memory data except for an item included in the first telemetry frame.

3. The method of claim 2, further comprising, after the analyzing of the memory data:
   displaying at least one result among a result of analyzing the first telemetry frame and a result of analyzing the memory data;
   debugging the satellite software based on a user input corresponding to the at least one result; and
   uploading the satellite software to the simulator, the satellite software having been debugged.

4. The method of claim 1, wherein the first communication mode provides a higher data rate than the second communication mode, and the second communication mode is a communication mode used to connect a satellite with a ground station.

5. A satellite software verification device using a simulator, the satellite software verification device comprising a controller configured to receive memory data of the simulator from the simulator in a first communication mode, the simulator being loaded with the satellite software to be verified, to generate a first telemetry frame from the memory data based on a telemetry frame generation rule, and to analyze the first telemetry frame,
- wherein the controller is further configured to receive a second telemetry frame from the simulator in a second communication mode and to analyze the second telemetry frame, the second communication mode being different from the first communication mode,
- wherein the controller is further configured to display at least one result among a result of analyzing the first telemetry frame and a result of analyzing the second telemetry frame, to debug the satellite software based on a user input corresponding to the at least one result, and to upload the satellite software to the simulator, the satellite software having been debugged.

6. The satellite software verification device of claim 5, wherein the controller is further configured to perform analysis on all items included in the memory data except for an item included in the first telemetry frame.

7. The satellite software verification device of claim 6, wherein the controller is further configured to display at least one result among a result of analyzing the first telemetry frame and a result of performing analysis on all items included in the memory data except for the item included in the first telemetry frame, to debug the satellite software based on a user input corresponding to the at least one result, and to upload the satellite software to the simulator, the satellite software having been debugged.

8. The satellite software verification device of claim 5, wherein the first communication mode provides a higher data rate than the second communication mode, and the second communication mode is a communication mode used to connect a satellite with a ground station.

9. A satellite software verification system comprising:
- a simulator configured to transmit memory data to a satellite software verification device in a first communication mode and to transmit a second telemetry frame to the satellite software verification device in a second communication mode, the simulator being loaded with satellite software to be verified; and
- the satellite software verification device configured to receive the memory data of the simulator from the simulator in the first communication mode, to generate a first telemetry frame from the memory data based on a telemetry frame generation rule, to analyze the first telemetry frame, to receive the second telemetry frame from the simulator in the second communication mode, and to analyze the second telemetry frame, the second communication mode being different from the first communication mode.

10. The satellite software verification system of claim 9, wherein the satellite software verification device is further configured to perform analysis on all items included in the memory data except for an item included in the first telemetry frame.

11. The satellite software verification system of claim 10, wherein the satellite software verification device is further configured to display at least one result among a result of analyzing the first telemetry frame, a result of analyzing the second telemetry frame, and a result of performing analysis on all items included in the memory data except for the item included in the first telemetry frame, to debug the satellite software based on a user input corresponding to the at least one result, and to upload the satellite software to the simulator, the satellite software having been debugged.

12. The satellite software verification system of claim 9, wherein the first communication mode provides a higher data rate than the second communication mode, and the second communication mode is a communication mode used to connect a satellite with a ground station.

* * * * *